United States Patent
Quan

(10) Patent No.: US 11,302,890 B2
(45) Date of Patent: Apr. 12, 2022

(54) ENCAPSULATION STRUCTURE WITH SUB-FILM LAYERS AND ENCAPSULATING METHOD THEREOFF

(71) Applicant: BOE TECHNOLOGY GROUP CO., LTD., Beijing (CN)

(72) Inventor: Wei Quan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 375 days.

(21) Appl. No.: 16/346,959

(22) PCT Filed: Dec. 10, 2018

(86) PCT No.: PCT/CN2018/120045
§ 371 (c)(1),
(2) Date: May 2, 2019

(87) PCT Pub. No.: WO2019/114648
PCT Pub. Date: Jun. 20, 2019

(65) Prior Publication Data
US 2021/0280821 A1 Sep. 9, 2021

(30) Foreign Application Priority Data
Dec. 15, 2017 (CN) .......................... 201711354185.6

(51) Int. Cl.
*H01L 33/00* (2010.01)
*H01L 51/52* (2006.01)

(52) U.S. Cl.
CPC ...... *H01L 51/5253* (2013.01); *H01L 51/5256* (2013.01)

(58) Field of Classification Search
CPC .................. H01L 51/3253; H01L 51/5256
See application file for complete search history.

(56) References Cited

U.S. PATENT DOCUMENTS

| 8,766,280 B2 | 7/2014 | Thoumazet et al. |
| 9,281,500 B2 | 3/2016 | Gong et al. |
| 2008/0254203 A1 | 10/2008 | Zhou et al. |

(Continued)

FOREIGN PATENT DOCUMENTS

| CN | 101970133 A | 2/2011 |
| CN | 104157790 A | 11/2014 |

(Continued)

OTHER PUBLICATIONS

Office Action dated Jan. 4, 2021, issued in counterpart CN Application No. 201711354185.6, with English Translation. (17 pages).

(Continued)

*Primary Examiner* — Phuc T Dang
(74) *Attorney, Agent, or Firm* — WHDA, LLP

(57) ABSTRACT

The present disclosure is related to an encapsulating method that may include forming an inorganic film layer covering a structure to be encapsulated. The inorganic film layer may include at least two sub-film layers. Among the at least two sub-film layers, densification of a sub-film layer farther away from the structure to be encapsulated may be greater than densification of a sub-film layer closer to the structure to be encapsulated.

16 Claims, 12 Drawing Sheets

(56) References Cited

U.S. PATENT DOCUMENTS

| | | | |
|---|---|---|---|
| 2012/0138938 A1* | 6/2012 | Bae | G02F 1/136286 257/59 |
| 2017/0125732 A1 | 5/2017 | Lee et al. | |
| 2018/0047800 A1* | 2/2018 | Choi | H01L 27/322 |

FOREIGN PATENT DOCUMENTS

| | | |
|---|---|---|
| CN | 106410062 A | 2/2017 |
| CN | 106654046 A | 5/2017 |
| CN | 107068904 A | 8/2017 |
| CN | 107338424 A | 11/2017 |
| JP | 2005209356 A | 8/2005 |
| KR | 10-2007-0046079 A | 5/2007 |
| KR | 10-2011-0068176 A | 6/2011 |
| KR | 10-2012-0106453 A | 9/2012 |
| KR | 10-2012-0107331 A | 10/2012 |

OTHER PUBLICATIONS

Office Action dated Oct. 28, 2020, issued in counterpart KR Application No. 10-2019-7017608, with English Translation. (8 pages).

Office Action dated Dec. 28, 2020, issued in counterpart KR Application No. 10-2019-7017608, with English Translation. (7 pages).

International Search Report dated Mar. 7, 2019, issued in counterpart Application No. PCT/CN2018/120045 (10 pages).

H. Mackel and R. Ludemann, "Detailed study of the composition of hydrogenated SiNx layers for high-quality silicon surface passivation", Journal of Applied Physics, Sep. 1, 2002, vol. 92, No. 5, pp. 2602-2609, cited in CN Office Action dated Oct. 25, 2019. (9 pages).

Office Action dated Oct. 25, 2019, issued in counterpart CN application No. 201711354185.6, with English translation. (15 pages).

Office Action dated Apr. 29, 2020, issued in counterpart KR Application No. 10-2019-7017608, with English Translation. (10 pages).

Office Action dated May 27, 2020, issued in counterpart CN Application No. 201711354185.6, with English Translation. (13 pages).

Office Action dated Aug. 17, 2021, issued in counterpart EP Application No. 18889442.2. (8 pages).

* cited by examiner

Prior Art

ENCAPSULATION STRUCTURE WITH SUB-FILM LAYERS AND ENCAPSULATING METHOD THEREOFF

CROSS-REFERENCE TO RELATED APPLICATIONS

This application claims benefit of the filing date of Chinese Patent Application No, 701711154185.6 filed on Dec. 25, 2017, the disclosure of which is hereby incorporated in its entirety by reference.

TECHNICAL FIELD

This disclosure relates to a display technology, in particular, to an encapsulation structure, an encapsulation method, art electroluminescent apparatus, and a display apparatus.

BACKGROUND

In recent years, breakthrough has been made in the development of organic light-emitting diode (OLED) devices. In order to improve stability and service life of the OLED device, it is usually necessary to encapsulate the OLED device with an encapsulation structure to isolate the OLED device from the outside environment. At present, the OLED device encapsulating methods mainly include plastic encapsulating and thin film encapsulation. According to different encapsulating materials, the thin film encapsulation (TFE) can be divided into inorganic thin film encapsulation, organic thin film encapsulation, and inorganic/organic composite thin film encapsulation.

The encapsulation structure formed by using TEE generally includes an inorganic film layer. In TEE, silicon nitride (SiNx) is generally used as a material, and a plasma enhanced chemical vapor deposition (PECVD) process is used to encapsulate the OLED. An inorganic film layer is formed as the outer layer of the device. However, the inorganic film layer is prone to cracks, and accordingly, the encapsulation performance of the encapsulation structure is poor.

BRIEF SUMMARY

Accordingly, one example of the present disclosure is an encapsulating method. The encapsulation method may include forming au inorganic film layer covering a structure to be encapsulated. The inorganic film layer may include at least two sub-film layers, and among the at least two sub-film layers, densification of a sub-film layer farther away from the structure to be encapsulated may be greater than densification of a sub-film layer closer to the structure to be encapsulated.

Forming the inorganic film layer covering the structure to be encapsulated may include forming each of the at least two sub-film layers sequentially on the structure to be encapsulated using a plasma mixture. An amount of a gas in the plasma mixture forming the sub-film layer farther away from the structure to be encapsulated may be greater than an amount of the gas in the plasma mixture forming the sub-film layer closer to the structure to be encapsulated. The amount of the gas in the plasma mixture forming each of the at least sub-film layers may increase at a gradient in accordance with sequence of formation of the at least two sub-film layers. In some embodiments, the amount of the gas in the plasma mixture forming each of the at least sub-film layers increases at the gradient x in accordance with the sequence of formation of the at least two sub-film layers, wherein x=5%*A, and A is an amount of the gas in the plasma mixture forming a sub-film layer closest to the structure to be encapsulated among the at least two sub-film layers.

The plasma mixture may include a mixture of silicon hydride, ammonia and hydrogen. The gas may be hydrogen. In the plasma mixture forming the sub-film layer closest to the structure to be encapsulated among the at least two sub-layers, a ratio of silicon hydride, ammonia and hydrogen may be within a range of [0.90, 1.10]:[0.78, 0.98]:[8.20, 8.40].

The encapsulating method may further include roughening a surface of each of the at least two sub-film layers. Roughening the surface of each of the at least two sub-film layers may include bombarding the surface of each of the at least two sub-film layers with a plasma. The plasma may be argon plasma.

Another embodiment of the present disclosure is an encapsulation structure. The encapsulation structure may include an inorganic film layer covering a structure to be encapsulated. The inorganic film layer may include at least two sub-film layers, and among the at least two sub-film layers, densification of a sub-film layer farther away from the structure to be encapsulated may be greater than densification of a sub-film layer closer to the structure to be encapsulated. The inorganic film layer may be made of SiNx or SiON. SiNx may be produced by a PECVD process from $SiH_4$, $NH_3$, and $H_2$. A volume ratio of $SiH_4$, $NH_3$, and $H_2$ may be in a range of [0.90, 1.10]:[0.78,0.98]:[8.20,8.40]. SiON may be produced by a PECVD process from $SiH_4$, $NH_3$, $H_2$ and $N_2O$.

The densification of each of the at least two sub-film layers may increase at a gradient from a sub-film layer closest to the structure to be encapsulated to a sub-film layer farthest away from the structure to be encapsulated. A surface of each of the at least two sub-film layers may have a rugged microstructure. A roughness of the surface of each of the at least two sub-film layers is within a range from 0.04 μm to 0.06 μm.

Another example of the present disclosure is an electroluminescent apparatus. The electroluminescent apparatus may include the encapsulation structure according to one embodiment of the present disclosure.

Another example of the present disclosure is a display apparatus. The display apparatus may include the electroluminescent apparatus according to one embodiment of the present disclosure.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the disclosure are apparent from the following detailed description taken in conjunction with the accompanying drawings in which:

DETAILED DESCRIPTION

Figure 1:
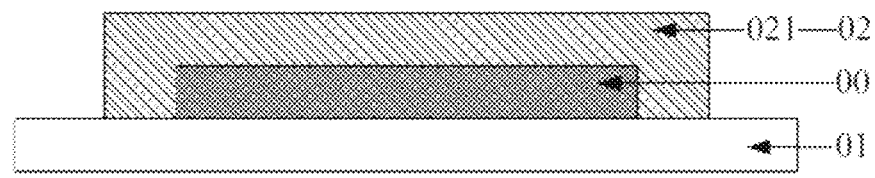
FIG. 1 shows a schematic diagram of an encapsulation structure provided in the prior art.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-12. When referring to the figures like structures and elements shown throughout are indicated with like reference numerals.

In the description of the specification, references made to the term "one embodiment," "some embodiments," "exemplary embodiments," "example" "specific example," "some examples" and the like are intended to refer that specific features and structures, materials or characteristics described in connection with the embodiment or example that are included in at least one embodiment or example of the present disclosure. The schematic expression of the terms does not necessarily refer to the same embodiment or example. Moreover, the specific features, structures, materials or characteristics described may be included in any suitable manner in any one or more embodiments or examples.

In order to improve the stability and service life of the OLED device, it is usually necessary to encapsulate the OLED device with an encapsulation structure. FIG. 1 shows a schematic diagram of an encapsulation structure 02 provided in the prior art. As shown in FIG. 1, the OLED device 00 is disposed on a base substrate 01, and the encapsulation structure 02 includes an inorganic film layer 021 disposed outside the DEED device 00. The inorganic film layer 021 can be formed by a PECVD process using SiNx, and the inorganic film layer 021 has a certain water-blocking property, which can isolate the OLED device 00 from the outside air. However, the Morgan is file layer 021 is prone to cracks, so that the encapsulation structure 02 has poor encapsulating performance.

The encapsulation structure provided by the embodiments of the present disclosure can reduce the probability of occurrence of cracks in the inorganic film layer and improve the encapsulation performance of the encapsulation structure. A detailed description of the encapsulation structure, the encapsulating method, and the display apparatus provided by the embodiments of the present disclosure is provided below.

Figure 2:
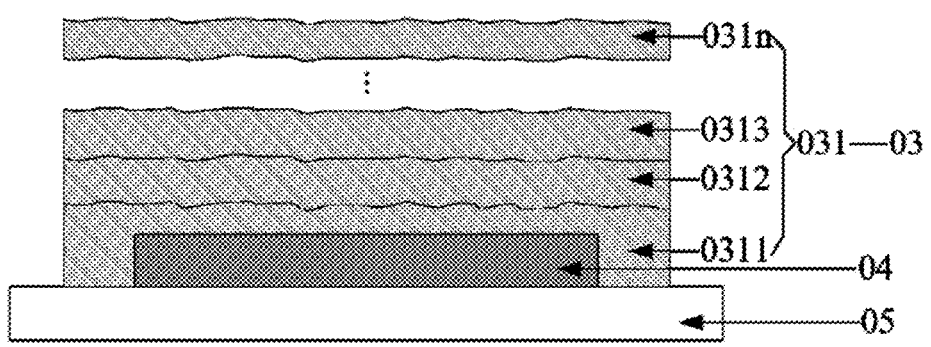
FIG. 2 shows a schematic diagram of an encapsulation structure provided according to one embodiment of the present disclosure.

FIG. 2 shows a schematic diagram of an encapsulation structure 03 provided according to one embodiment of the present disclosure. As shown in FIG. 2, the encapsulation structure 03 includes an inorganic film layer 031 coated on an external surface of the structure to be encapsulated 04, and the inorganic film layer 031 includes at least two sub-film layers. Among the at least two sub-film layers, the densification of the sub-film layer farther away from the structure to be encapsulated is greater than densification of the sub-film layer closer to the structure to be encapsulated. In one embodiment, as shown in FIG. 2, the at least two sub-film layers may be sub-film layer 0311 to sub-film layer 031$n$, where n is an integer greater than or equal to 2. The sub-film layers are sequentially disposed farther away from the structure to be encapsulated 04 from the sub-film layer 0311 to the sub-film layer 031$n$. Therefore, the sub-film layer 0312 is denser than the sub-film layer 0311, the sub-film layer 0313 is denser than the sub-film layer 0312, and so on. The sub-film layer 031$n$ is denser than the sub-film layer 031M-1). Furthermore, as shown in FIG. 2, the structure to be encapsulated 04 is disposed on the base substrate 05.

In the encapsulation structure provided in the embodiment of the present disclosure, since the inorganic film layer includes at least two sub-film layers, the densification of the sub-film layer farther away from the structure to be encapsulated is greater than the densification of the sub-files layer closer to the structure to be encapsulated among the at least two sub-film layers. Therefore, the probability of occurrence of cracks in the inorganic film layer can be reduced, and the problem of poor encapsulation performance of the encapsulation structure can be solved. As a result, the encapsulation performance of the encapsulation structure can be improved.

In one embodiment, among the at least two sub-film layers, the densification of each sub-film layer may be characterized by a refractive index of each sub-film layer, and the densification of each sub-film layer is positively correlated to the refractive index of each sub-film layer. Alternatively, among the at least two sub-film layers, the densification of each sub-film layer may be characterized by a corrosion rate of each sub-film layer, and the densification of each sub-film layer is inversely correlated to the corrosion rate of each sub-film layer. Alternatively, among the at least two sub-film layers, the densification of each sub-film layer may be characterized by the refractive index of each sub-film layer and the corrosion rate of each sub-film layer. The densification of each sub-film layer is positively correlated to the refractive index of each sub-film layer. The density of each sub-film layer is inversely correlated to the corrosion rate of each sub-film layer. Of course, in addition, the densification of the sub-film layer may also be characterized by other physical parameters of the sub-film layer.

In one embodiment, the densification of the at least two sub-film layers of the inorganic film layer 031 increases in a gradient from the sub-film layer near the structure to be encapsulated 04 to the sub-film layer away from the structure to be encapsulated 04, thereby achieving stepwise increase in the densification of the inorganic film layers 031. That is, the densification of the at least two sub-film layers of the inorganic film layer 031 increases by equal gradients from the sub-film layer closer to the structure to be encapsulated 04 to the sub-film layer farther away from the structure to be encapsulated 04. For example, the densification of the sub-film layer 0311 to the sub-film layer 031$n$ increases by an equal gradient.

In one embodiment, as shown in FIG. 2, the surface of each of the at least two sub-film layers of the inorganic film layer 031 has a rugged microstructure. In other words, the surface of each of the at least two sub-film layers of the inorganic film layer 031 is rough. In one embodiment, the surface roughness of each sub-film layer ranges from 0.04 μm to 0.06 μm. The surface roughness of each of the at least two sub-film layers of the inorganic film layer 031 may be equal or not equal, but the surface roughness of any sub-film layer may range from 0.04 μm to 0.06 μm. For example, in one embodiment, the surface roughness of the sub-film layer 0311 is 0.041 μm, the surface roughness of the sub-film layer 0312 is 0.042 μm, the surface roughness of the sub-film layer 0313 is 0.05 μm, and the surface roughness of the sub-film layer 031$n$ is 0.058 μm or the like. The microstructure can scatter light, so that the surface of the sub-film layer is uneven and the light can be scattered on the surface of the sub-film layer. When a light emitting body is encapsulated by the encapsulation structure 03, the surface of the sub-film layer is a rugged microstructure that can improve the light extraction efficiency of the encapsulation structure 03 and facilitate light extraction. The light emitting body may be an unencapsulated OLED apparatus, and the surface of the sub-film layer is uneven and the microstructure is favorable to the apparatus of the top emission structure, which is a structure in which light is emitted from a side of the unencapsulated OLED apparatus away from the substrate.

Figure 3:
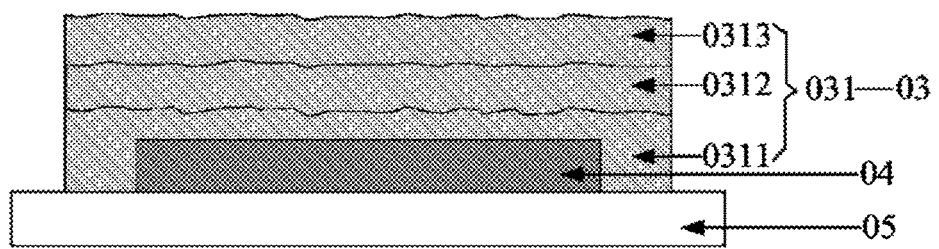
FIG. 3 shows a schematic diagram of an encapsulation structure provided according to one embodiment of the present disclosure.

FIG. 3 shows a schematic diagram of an encapsulation structure 03 provided according to one embodiment of the present disclosure. As shown in FIG. 3, the at least two sub-film layers of the inorganic film layer 031 are three sub-film layers. The three sub-film layers are sub-film layer 0311, sub-film layer 0312, and sub-film layer 0313 arranged in this order away from the structure to be encapsulated 04.

The encapsulation structure 03 shown in FIGS. 2 and 3 may be an inorganic thin film encapsulation structure. The encapsulation structure 03 provided in the embodiment of the present disclosure may also be an inorganic/organic composite film encapsulation structure. The inorganic/organic composite film encapsulation structure may be as shown in FIG. 4.

Figure 4:
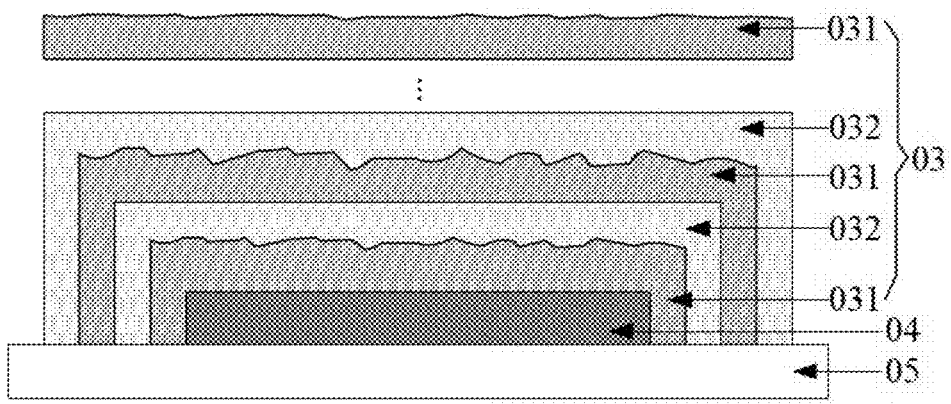
FIG. 4 shows a schematic diagram of an encapsulation structure provided according to one embodiment of the present disclosure.

FIG. 4 shows a schematic diagram of an encapsulation structure 03 provided according to one embodiment of the present disclosure. In one embodiment, as shown in FIG. 4, the encapsulation structure 03 includes an inorganic film layer 031 and an organic film layer 032 alternately superimposed on an external surface of the structure to be encapsulated FIG. 4. The structure of any two inorganic film layers 031 may be the same, and the structure of each inorganic film layer 031 can be as shown in FIG. 2 or FIG. 3. In the embodiment of the present disclosure, the sub-film layers of the inorganic film layer 031 are not drawn in FIG. 4 for the convenience of drawing.

In the embodiments of the present disclosure, the structure to be encapsulated 04 may be an unencapsulated electroluminescent apparatus. The electroluminescent apparatus may be an OLED display apparatus or an OLED lighting apparatus. In addition, the structure to be encapsulated may also be a quantum dot light emitting diode (QLED) display apparatus or a QLED lighting apparatus. The base substrate 05 may include a display area and a non-display area, and a display apparatus such as an OLED display apparatus may be disposed on the display area of the base substrate 05. The base substrate 05 may be a transparent substrate, which may be a substrate made of light-guiding non-metallic materials with certain sturdiness such as glass, quartz, and transparent resin. In addition, a flexible substrate (not shown in FIGS. 2 to 4) may be generally disposed on the base substrate 05, and the display apparatus may be disposed on the flexible substrate. After the encapsulation structure 03 is formed, the base substrate 05 can be peeled off from the flexible substrate, and the flexible substrate can be used for flexible display. The flexible substrate may be a flexible substrate formed using polyimide (PI). The inorganic film layer 031 may be made of SiNx or SiON (silicon oxynitride), and the inorganic film layer 031 may be formed by a PECVD process. SiNx is typically produced by a PECVD process from silicon hydride ($SiH_4$), ammonia ($NH_3$) and by ($H_2$). SiON is usually produced by a PECVD process from $SiH_4$, $NH_3$, $H_2$ and nitrous oxide ($N_2O$). The organic film layer 032 may be formed using an ink jet printing process or a coating process.

In one embodiment, the encapsulation structure 03 may further include a cover plate (not shown in FIGS. 2 to 4) disposed outside the encapsulation film layer farthest away from the structure to be encapsulated 04. The encapsulation film farthest away from the structure to be encapsulated 04 may be an inorganic film layer or an organic film layer. The cover plate may be a light-transmitting, non-metallic, transparent substrate such as glass, quartz, transparent resin, etc., or may be a flexible substrate formed using PI, which is not limited in this embodiment of the present disclosure.

In the encapsulation structures provided in the embodiments of the present disclosure, since the inorganic film layer includes at least two sub-film layers, the densification of the sub-film layer farther away from the structure to be encapsulated is greater than the densification of the sub-film layer closer to the structure to be encapsulated among the at least two sub-film layers. Therefore, the probability of occurrence of cracks in the inorganic film layer can be reduced, and the problem of poor encapsulation performance of the encapsulation structure can be solved. As such, the encapsulation performance of the encapsulation structure can be improved.

In the embodiments of the present disclosure, the inorganic film layer adopts a layered structure, which can reduce the risk of stress increase of the inorganic film layer while improving densification.

The encapsulation structure provided by the embodiment of the present disclosure may be produced using the following method. The encapsulating method and the encapsulation principle of the embodiment of the present disclosure can be referred to the description in the following embodiments.

An embodiment of the present disclosure further provides an encapsulating method. The encapsulating method can be used to encapsulate a structure to be encapsulated and form an encapsulation structure. In one embodiment, the encapsulating method includes the following:

An inorganic film layer covering the structure to be encapsulated is formed on the outside of the structure to be encapsulated, and the inorganic film layer includes at least two sub-film layers. Among the at least two sub-film layers, the densification of the sub-film layer farther away from the structure to be encapsulated is greater than the densification of the sub-film layer closer to the structure to be encapsulated.

In one embodiment, among the at least two sub-film layers, the densification of each sub-film layer is characterized by a refractive index of each sub-film layer, and the densification of each sub-film layer is positively correlated to the refractive index of each sub-film layer.

In one embodiment, among the at least two sub-film layers, the densification of each sub-film layer is characterized by a corrosion rate of each sub-film layer, and the densification of each sub-film layer is negatively correlated to the corrosion rate of each sub-film layer.

In one embodiment, an inorganic film layer is formed outside the structure to be encapsulated, and the inorganic film layer includes at least two sub-film layers. Among the at least two sub-film layers, the densification of the sub-film layer farther away from the structure to be encapsulated is greater than the densification of the sub-film layer closer to the structure to be encapsulated. The method includes forming the at least two sub-film layers sequentially on the outside of the structure to be encapsulated by using a plasma mixture, wherein an amount of a preset gas in the plasma mixture forming the sub-film layer farther away from the structure to be encapsulated is greater than an amount of the preset gas in the plasma mixture forming the sub-film layer closer to the structure to be encapsulated. As such, the inorganic film layer is obtained.

In one embodiment, the amount of the preset gas in the plasma mixtures increases at a gradient in accordance with the formation sequence of the at least two sub-layers.

In one embodiment, the amount of the preset gas in the plasma mixtures increases at a gradient x of 5%*A in the order of formation of the at least two sub-film layers. The term "A" denotes the amount of the preset gas in the plasma mixture forming the sub-film layer closest to the structure to be encapsulated among the at least two sub-film layers.

In one embodiment, the plasma mixture is a mixed gas of silicon hydride, ammonia, and hydrogen, and the preset gas is hydrogen.

In one embodiment, the ratio of silicon hydride, ammonia, and hydrogen in the plasma mixture that forms the closest sub-film layer to the structure to be encapsulated among the at least two sub-film layers is in the range of [0.90, 1.10]: [0.78, 0.98]:[820, 8.40].

In one embodiment, the encapsulating method further includes roughening the surface of each of the at least two sub-film layers. Roughening the surface of each of the at least two sub-film layers may include bombarding the surface of each of the at least two sub-film layers with a preset plasma to roughen the surface of each of the at least two sub-film layers. In one embodiment, the preset plasma is argon plasma.

In one embodiment, the surface roughness of each of the at least two sub-film layers ranges from 0.04 μm to 0.06 μm.

In one embodiment, the encapsulating method further includes forming an organic film layer covering the inorganic film layer.

All of the foregoing optional technical solutions may be combined randomly to form alternative embodiments of the present disclosure, and will not be repeated here.

In the encapsulating method provided in the embodiment of the present disclosure, since the inorganic film layer includes at least two sub-film layers, the densification of the sub-film layer farther away from the structure to be encapsulated is greater than the densification of the sub-film layer closer to the structure to be encapsulated among the at least two sub-film layers. Therefore, the probability of occurrence of cracks in the inorganic film layer can be reduced, and the problem of poor encapsulation performance of the encapsulation structure can be solved. As such, the encapsulation performance of the encapsulation structure can be improved.

Figure 5:
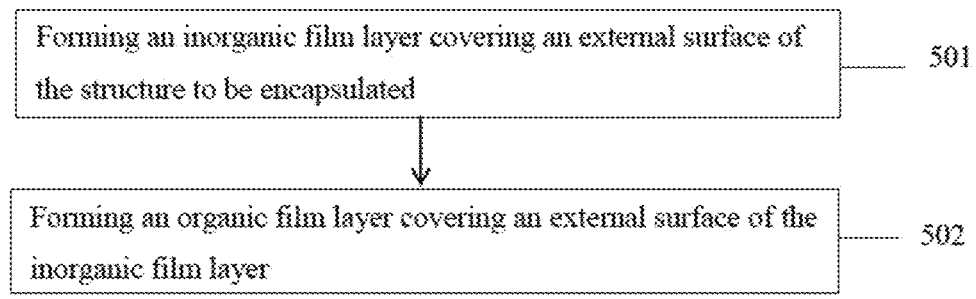
FIG. 5 is a flowchart of a encapsulating method according to an embodiment of the present disclosure.

FIG. 5 shows a flowchart of an encapsulating method provided by an embodiment of the present disclosure. The encapsulating method can be used to encapsulate a structure to be encapsulated to form an encapsulation structure. The encapsulation structure may be the encapsulation structure shown in any one of FIG. 2 to FIG. 4. As shown in FIG. 5, the encapsulating method includes the following:

In step 501, an inorganic film layer covering an external surface of the structure to be encapsulated is formed. The inorganic film layer includes at least two sub-film layers. Among the at least two sub-film layers, the densification of the sib-film layer farther away from the structure to be encapsulated is greater than the densification of the sub-film layer closer to the structure to be encapsulated.

As shown in each of FIGS. 2 to 4, the structure to be encapsulated 04 is disposed on the base substrate 05, and the inorganic film layer 031 that covers the structure to be encapsulated 04 is formed outside the structure to be encapsulated 04. That is, the inorganic film layer 031 is formed on the base substrate 05 having the structure to be encapsulated 04 formed thereon. The inorganic film layer 031 covers the outside of the structure to be encapsulated 04, and the inorganic film layer 031 includes at least two sub-film layers. Among the at least two sub-film layers, the densification of the sub-film layer farther away from the structure to be encapsulated 04 is greater than the densification of the sub-film layer closer to the structure to be encapsulated 04.

In one embodiment, as shown in FIG. 2, the inorganic film layer 031 includes n sub-film layers of sub-layer 0311 to sub-layer 031*n*. The densification of the sub-film layer 0312 is greater than the densification of the sub-film layer 0311, the densification of the sub-film layer 0313 is greater than the densification of the sub-film layer 0312, and so on.

In another embodiment, as shown in FIG. 3, the inorganic film layer 031 includes three sub-film layers of sub-film layer 0311, sub-film layer 0312, and sub-film layer 0313. The densification of the sub-layer 0312 is greater than that of the sub-layer 0311, and the densification of the sub-layer 0313 is greater than that of the sub-layer 0312. In the embodiments of the present disclosure, the densification of the sub-film layer may be characterized by a refractive index, and the densification of each sub-film layer is positively correlated to the refractive index of each sub-film layer. That is, for a certain sub-film layer, the higher the refractive index of the sub-film layer, the higher the densification of the sub-film layer. Alternatively, the densification of the sub-film layers can be characterized by the corrosion rate, and the densification of the sub-film layers is inversely correlated, to the corrosion rates of the sub-film layers respectively. That is, the lower the corrosion rate of the sub-film layer, the higher the densification of the sub-film layer. Alternatively, the densification of the sub-film layer can be characterized by the refractive index and the corrosion rate, which are not limited in the embodiment of the present disclosure.

Figure 6:
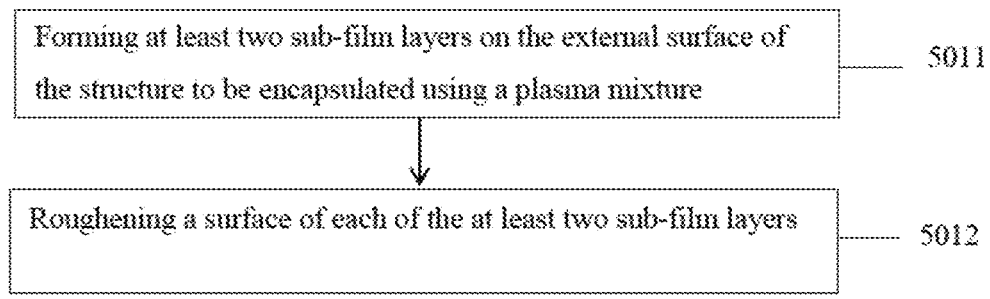
FIG. 6 is a flowchart of a method for forming an inorganic film layer on an external surface of a structure to be encapsulated according to an embodiment of the present disclosure.

FIG. 6 shows a flowchart of a method of forming an inorganic film layer 031 covering the structure to be encapsulated 04 on the outside of the structure to be encapsulated 04 according to an embodiment of the present disclosure. As shown in FIG. 6, the method includes the following:

In sub-step 5011, at least two sub-film layers are formed on the outside of the structure to be encapsulated using a plasma mixture. The amount of the preset gas in the plasma mixture forming the sub-film layer farther away from the structure to be encapsulated is greater than the amount of the preset gas in the plasma mixture forming the sub-film layer closer to the structure to be encapsulated.

In the embodiment of the present disclosure, when forming the at least two sub-film layers, a sub-film layer closer to the structure to be encapsulated is formed first, and then a sub-film layer farther away from the structure to be encapsulated is formed. Therefore, the amount of the preset gas in the plasma mixture can be increased in sequence according to the formation order of the at least two sub-film layers, so that the densification of the at least two sub-film layers can be sequentially increased. In one embodiment, in order to increase the densities of the at least two sub-film layers at a gradient, the amount of the preset gas in the plasma mixtures may increase at a gradient according to the order of formation of the at least two sub-film layers. In one embodiment, the amount of the preset gas in the plasma mixtures can be increased by equal gradients according to the order of the formation of the at least two sub-layers so that the densities of the at least two sub-film layers increase by equal gradients. In one embodiment, in order to make the densities of any two neighboring sub-film layers less different, the amount of the preset gas in the plasma mixture may increase by a gradient of x=5%*A in accordance with the formation sequence of at least two sub-film layers. The term "A" is the amount of a preset gas in the plasma mixture forming the sub-layer film closest to the structure to be encapsulated among the at least two sub-film layers.

In the embodiments of the present disclosure, the material for forming each of the at least two sub-film layers may be SiNx gar SiON.

When the material for forming each of the at least two sub-layers is SiNx, the plasma mixture for forming each sub-film layer may be a mixture of $SiH_4$, $NH_3$, and $H_2$. As such, the process of forming a sub-film layer may include exciting a mixture of $SiH_4$, and $H_2$ to form a plasma mixture through a PECVD process, forming SiNx from the mixture of $SiH_4$, $NH_3$, and $H_2$, depositing the SiNx outside the structure to be encapsulated 04 to form a SiNx layer, and processing the SiNx layer through one patterning process to obtain the sub-film layer. The step of exciting a mixture of $SiH_4$, $NH_3$, and $H_2$ to form a plasma mixture through a PECVD process can refer to related relevant art.

The one patterning process may include photoresist coating, exposure, development, etching, and photoresist stripping. In one embodiment, processing the SiNx layer through one patterning process to obtain the sub-film layer includes the following:

First, a layer of photoresist is coated on the SiNx layer to obtain a photoresist layer, and then the photoresist layer is exposed using a mask to form a fay exposed area and a non-exposed area of the photoresist layer. Then, after the exposed photoresist layer is processed by a developing process, the photoresist in the fully exposed area is removed, and the photoresist in the non-exposed area is retained. Then, the corresponding area of the fully exposed area on the SiNx layer is etched. Finally, the photoresist in the non-exposed area is stripped, and a sub-film layer is formed on the SiNx layer corresponding to the non-exposed area. The embodiments of the present disclosure are described by using a positive photoresist to form a sub-film layer as an example. In practical applications, a negative photoresist may also be used to form a sub-film layer.

When the material for forming each of the at least two sub-film layers is SiON, the plasma mixture for forming each sub-film layer may be a mixture of $SiH_4$, $NH_3$, $H_2$, and SiON. As such, the process of forming a sub-film layer may include exciting a mixture of $SiH_4$, $NH_3$, $H_2$ and SiON to form a plasma mixture through a PECVD process, forming SiON from the mixture of $SiH_4$, $NH_3$, $H_2$ and SiON, depositing the SiON outside the structure to be encapsulated 04 to form a SiON layer, and processing the SiON layer through one patterning process to obtain the sub-film Meyer. The step of exciting a mixture of $SiH_4$, $NH_3$, $H_2$ and SiON to form a plasma mixture through a PECVD process can refer to related relevant art. The step of processing the SiON layer through one patterning process is similar the above step of processing the SiNx layer through one patterning process, which will not be repeated here.

In the embodiments of the present disclosure, when the plasma mixture forming the at least two sub-film layers may be a mixed gas of $SiH_4$, $NH_3$, and $H_2$, the preset gas may be $H_2$. In one embodiment, when the at least two sub-film layers are sub-film layer 0311, sub-film layer 0312 and sub-film layer 0313 shown in FIG. 3, the amount of $H_2$ in the plasma mixture forming the sub-film layer 0311 may be A. The amount of $H_2$ in the plasma mixture forming the sub-layer 0312 may be A+5% a, and the amount of $H_2$, in the plasma mixture forming the sub-layer 0313 may be A+10% a. In one embodiment, in the plasma mixture forming the sub-film layer closest to the structure 04 to be encapsulated among the at least two sub-film layers, the volume ratio of $SiH_4$, $NH_3$, and $H_2$ may be in the range of [0.90, 1.10]:[0.78,0.98]:[8.20,8.40]. In one embodiment, the volume ratio of $SiH_4$, $NFI_3$, and $H_2$ is 1:0.88:8.3. In the embodiments of the present disclosure, the composition of the plasma mixture, the ratio of $SiH_4$, $NH_3$, and $H_2$ in the plasma mixture forming the sub-film layer closest to the structure 04 to be encapsulated among the at least two sub-film layers, and the gradient of 5% A are only exemplary and not limited in the embodiments of the present disclosure.

In the embodiments of the present disclosure, on one hand, $H_2$ can decompose $SiH_4$ into $SiH_3+$ and $SiH_2+$, $SiH_2+$ can react with $SiH_4$ to consume reactants, and $H_2$ can also react with $SiH_2+$. On the other hand, $H_2$ facilitates the diffiision of $SiH_3+$ and allows $SiH_3+$ to pow at regular positions. By increasing the amount of in the plasma mixtures forming the sub-film layers, the activity of the film-forming material can be increased, thereby increasing the densification of the formed sub-film layers. Furthermore, the hydrogen content in the formed sub-film layers also increases.

In sub-step 5012, the surface of each of the at least two sub-film layers is roughened. In one embodiment, a preset plasma may be used to bombard the surface of each of the at least two sub-film layers to roughen the surface of each of the at least two sub-film layers. The preset plasma may be an argon (Ar) plasma. After roughening, the surface roughness of each of the at least two sub-film layers may be within a range from 0.04 μm to 0.06 μm.

In one embodiment, a low power Ar plasma can be used to bombard the surface of the sub-film layer to treat the less dense areas of the sub-film layer, and the denser areas are retained, thereby improving the film quality of the sub-film layers. This low power is usually half the power of the bombarding apparatus. After roughening the surface of the sub-film layer, the surface of the sub-film layer can form a rugged microstructure, winch improves the light extraction efficiency of the encapsulation structure and facilitates light extraction, which is advantageous for the display device of top emission structure.

In one embodiment, each time a sub-film layer is formed, the surface of the sub-film layer is roughened. Then, a sub-film layer is formed on the sub-film layer after the roughening treatment, and the surface of the formed sub-film layer is roughened again, and so on. That is, the above sub-step 5011 and sub-step 5012 can actually be Alternated. In the embodiments of the present disclosure, the sub-film layer is formed by using a mixed gas of $SiH_4$, $NH_3$, and $H_2$, and the process of forming the inorganic film layer 031 shown in FIG. 3 is described with reference to FIGS. 7 to 11.

Figure 7:
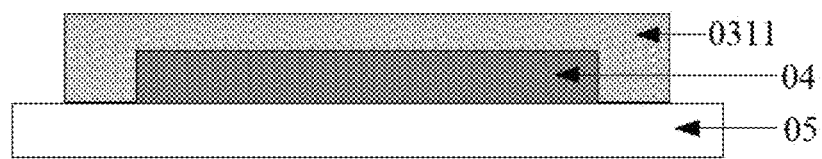
FIG. 7 is a schematic diagram of sub-film layer 0311 formed on an external surface of a structure to be encapsulated according to an embodiment of the present disclosure.
Figure 8:
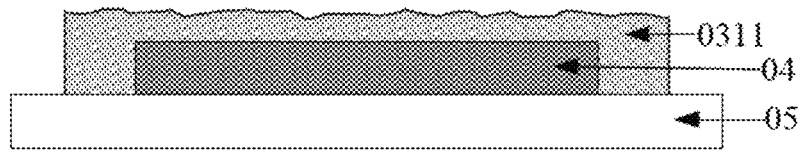
FIG. 8 is a schematic diagram of a surface of sub-film layer 0311 after roughening treatment according to an embodiment of the present disclosure.
Figure 9:
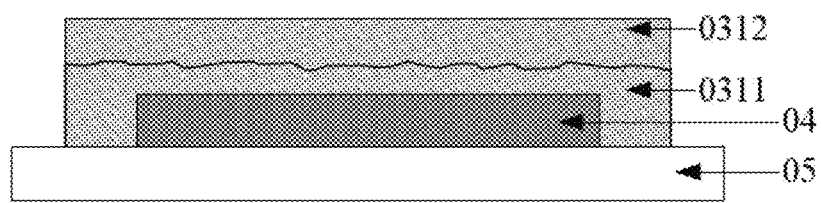
FIG. 9 is a schematic diagram of sub-layer 0312 formed on sub-film layer 0311 according to an embodiment of the present disclosure.
Figure 10:
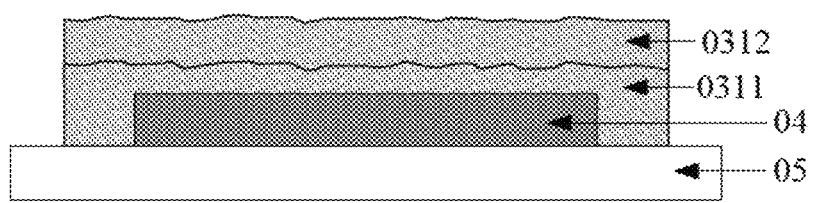
FIG. 10 is a schematic diagram of a surface of sub-film layer 0312 after roughening, treatment according to an embodiment of the present disclosure.
Figure 11:
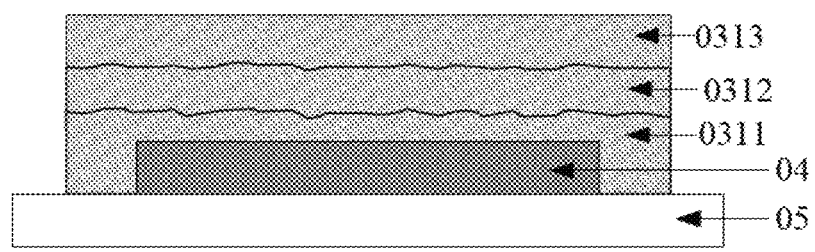
FIG. 11 is a schematic diagram of sub-layer 0313 formed on sub-layer 0312 according to an embodiment of the present disclosure.

First, a sub-film layer 0311 is formed outside the structure to be encapsulated 04 according to the method provided in sub-step 5011. The surface of the sub-film layer 0311 is a smooth plane. At this time, the sub-film layer 0311 is as shown in FIG. 7. Then, the surface of the sub-film layer 0311 is roughened according to the method provided in sub-step 5012. After processing, the sub-film layer 0311 is shown in FIG. 8, Then, a sub-film layer 0312 is filmed on the sub-film layer 0311 according to the method provided in sub-step 5011. The surface of the sub-film layer 0312 is a smooth plane. At this time, the sub-film layer 0312 is as shown in FIG. 9. Then, the surface of the sub-film layer 0312 is roughened according to the method provided in sub-step 5012. After processing, the sub-film layer 0312 is shown in FIG. 10. Then, a sub-film layer 0313 is formed on the sub-film layer 0312 according, to the method provided in sub-step 5011. The surface of the sub-film layer 0313 is a smooth plane. At this time, the sub-film layer 0313 is as shown in FIG. 11. Finally, the surface of the sub-film layer 0313 is roughened according to the method provided in sub-step 5012. After processing, the sub-film layer 0313 is as shown in FIG. 3. Thus, the inorganic film layer 031 shown in FIG. 3 is obtained.

In step 502, an organic film layer covering an external surface of the inorganic film layer is formed.

Figure 12:
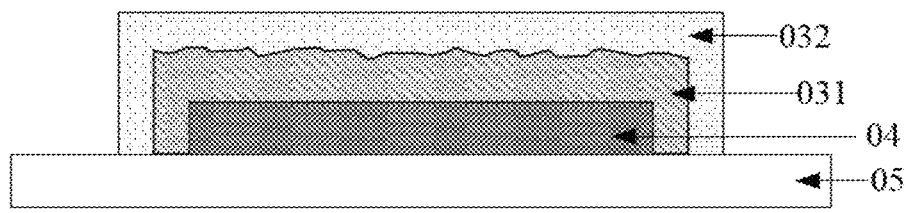
FIG. 12 is a schematic diagram of an organic film layer formed on an inorganic film layer according to an embodiment of the present disclosure.

FIG. 12 shows a schematic diagram of an organic film layer 032 covering the inorganic film layer 031 according to an embodiment of the present disclosure. As shown in FIG. 12, the organic film layer 032 covers the inorganic film layer 031. In one embodiment, an organic film layer 032 can be formed at an external surface of the inorganic film layer 031 by using an ink jet printing process with an acrylic or epoxy resin. The arrangement of the organic film layer 032 can improve the bendability of the encapsulation structure and facilitate realization of curved surface display. For the process of forming the organic film layer 032 by the ink jet printing process, reference may be made to related technologies, and the embodiments of the present disclosure will not be repeated here.

According to the encapsulating method provided in the embodiment of the present disclosure, since the inorganic film layer includes at least two sub-film layers, among the at least two sub-film layers, the densification of the sub-film layer farther away from the structure to be encapsulated is greater than the densification of the sub-film layer closer to the structure to be encapsulated. Therefore, the probability of occurrence of cracks in the inorganic film layer can be reduced, and the problem of poor encapsulation performance of the encapsulation structure can be solved. As such, the encapsulation performance of the encapsulation structure can be improved.

An embodiment of the present disclosure further provides an electroluminescent apparatus. The electroluminescent apparatus includes the encapsulation structure 03 shown in any one of FIGS. 2 to 4. In addition, the electroluminescent apparatus may further include an electroluminescent component, and the encapsulation structure 03 is used to encapsulate the electroluminescent component. The electroluminescent apparatus may be an OLED display apparatus or an OLED lighting apparatus. In addition, the electroluminescent apparatus can also be a QED display apparatus or a OLED lighting apparatus.

An embodiment of the present disclosure further provides a display apparatus including an electroluminescent apparatus according one embodiment of the present disclosure. The electroluminescent apparatus may be an OLED display apparatus or an OLED lighting apparatus. The display apparatus may be any product or component having a display function such as a mobile phone, a tablet computer, a television set, a display, a notebook computer, a digital photo frame, or a navigator.

Those of ordinary skill in the art may understand that all or part of the steps fix implementing the above embodiments may be completed by hardware, or may be instructed by a program to perform the relevant hardware, and the program may be stored in a computer-readable storage medium. The storage medium mentioned may be a read-only memory, a magnetic disk or an optical disk.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary shill in the art to understand the embodiments disclosed herein.

What is claimed is:

1. An encapsulating method, comprising:
    forming an inorganic film layer covering a structure to be encapsulated,
    wherein the inorganic film layer comprises at least two sub-film layers, and among the at least two sub-film layers, densification of a sub-film layer farther away from the structure to be encapsulated is greater than densification of a sub-film layer closer to the structure to be encapsulated; and
    wherein forming the inorganic film layer covering the structure to be encapsulated comprises:
    forming each of the at least two sub-film layers sequentially on the structure to be encapsulated using a plasma mixture,
    wherein an amount of a gas in the plasma mixture forming the sub-film layer farther away from the structure to be encapsulated is greater than an amount of the gas in the plasma mixture forming the sub-film layer closer to the structure to be encapsulated.

2. The encapsulating method according to claim 1, wherein the amount of the gas in the plasma mixture forming each of the at least sub-film layers increases at a gradient in accordance with sequence of formation of the at least two sub-film layers.

3. The encapsulating method according to claim 2, wherein the amount of the gas in the plasma mixture forming each of the at least sub-film layers increases at the gradient x in accordance with the sequence of formation of the at least two sub-film layers,
    wherein x=5%*A, and A is an amount of the gas in the plasma mixture forming a sub-film layer closest to the structure to be encapsulated among the at least two sub-film layers.

4. The encapsulating method according to claim 1, wherein the plasma mixture comprises a mixture of silicon hydride, ammonia and hydrogen.

5. The encapsulating method according to claim 4, wherein in the plasma mixture forming the sub-film layer closest to the structure to be encapsulated among the at least two sub-layers, a ratio of silicon hydride, ammonia and hydrogen is within a range of [0.90, 1.10]:[0.78, 0.98]:[8.20, 8.40].

6. The encapsulating method according to claim 1, wherein the gas is hydrogen.

7. The encapsulating method according to claim 1, further comprising:
roughening a surface of each of the at least two sub-film layers.

8. The encapsulating method according to claim 7, wherein roughening the surface of each of the at least two sub-film layers comprises:
bombarding the surface of each of the at least two sub-film layers with a plasma.

9. The encapsulating method according to claim 8, wherein the plasma is argon plasma.

10. An encapsulation structure, comprising:
an inorganic film layer covering a structure to be encapsulated,
wherein the inorganic film layer comprises at least two sub-film layers, and among the at least two sub-film layers, densification of a sub-film layer farther away from the structure to be encapsulated is greater than densification of a sub-film layer closer to the structure to be encapsulated;
the inorganic film layer is made of SiNx;
SiNx is produced by a PECVD process from $SiH_4$, $NH_3$, and Hz; and
a volume ratio of $SiH_4$, $NH_3$, and Hz is in a range of [0.90, 1.10]:[0.78,0.98]:[8.20,8.40].

11. The encapsulation structure according to claim 10, wherein the densification of each of the at least two sub-film layers increases at a gradient from a sub-film layer closest to the structure to be encapsulated to a sub-film layer farthest away from the structure to be encapsulated.

12. The encapsulation structure according to claim 10, wherein a surface of each of the at least two sub-film layers has a rugged microstructure.

13. The encapsulation structure according to claim 12, wherein a roughness of the surface of each of the at least two sub-film layers is within a range from 0.04 µm to 0.06 µm.

14. An electroluminescent apparatus, comprising the encapsulation structure according to claim 10.

15. A display apparatus, comprising the electroluminescent apparatus according to claim 14.

16. An encapsulation structure, comprising:
an inorganic film layer covering a structure to be encapsulated,
wherein the inorganic film layer comprises at least two sub-film layers, and among the at least two sub-film layers, densification of a sub-film layer farther away from the structure to be encapsulated is greater than densification of a sub-film layer closer to the structure to be encapsulated;
the inorganic film layer is made of SiON; and
wherein SiON is produced by a PECVD process from $SiH_4$, $NH_3$, $H_2$ and $N_2O$.

* * * * *